United States Patent
Rhee et al.

(10) Patent No.: US 6,807,238 B1
(45) Date of Patent: Oct. 19, 2004

(54) METHOD AND APPARATUS FOR DECODING M-PSK TURBO CODE USING NEW APPROXIMATION TECHNIQUE

(75) Inventors: Dojun Rhee, Irvine, CA (US); Advait Mogre, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 656 days.

(21) Appl. No.: 09/773,033

(22) Filed: Feb. 1, 2001

(51) Int. Cl.[7] .............................................. H03D 3/22
(52) U.S. Cl. ...................... 375/340; 375/329; 375/265; 375/341; 714/786; 714/791; 714/794; 714/796
(58) Field of Search ................................ 375/329, 265, 375/341; 714/786, 790

(56) References Cited

U.S. PATENT DOCUMENTS

| | | | |
|---|---|---|---|
| 5,754,600 A | * 5/1998 | Rahnema | 375/341 |
| 5,838,728 A | * 11/1998 | Alamouti et al. | 375/265 |
| 6,101,626 A | * 8/2000 | Morelos-Zaragoza et al. | 714/786 |
| 6,134,696 A | * 10/2000 | Morelos-Zaragoza et al. | 714/790 |
| 6,421,400 B1 | * 7/2002 | Rhee et al. | 375/329 |

* cited by examiner

*Primary Examiner*—Stephen Chin
*Assistant Examiner*—Sudhanshu C. Pathak
(74) *Attorney, Agent, or Firm*—Sawyer Law Group

(57) ABSTRACT

The method of the present invention decodes a received symbol that represents data bits including message bits and parity-check bits. The method comprises (a) mapping the symbol onto a received signal point in a signal space, the signal point having an in-phase component (I) and a quadrature phase component (Q) in the signal space; (b) computing reliability information for each data bit, the reliability information associated with a distance $d_i = \sqrt{(I-I_i)^2+(Q-Q_i)^2}$ between the received signal point (I, Q) and a reference constellation point $(I_i, Q_i)$ in the signal space, where i=0, 1, ..., M-1 (for M an integer), by replacing calculation of $(I-I_i)^2+(Q-Q_i)^2$ with calculation of $2(I_i \times I + Q_i \times Q)$; (c) decoding the received symbol using the reliability information and a priori information to produce estimated message bits, the a priori information having a predetermined value in a first decoding; (d) calculating difference between received message bits and the estimated message bits to produce extrinsic information of estimated message bits; and (e) repeating at least once the mapping, computing, decoding and calculating, using the extrinsic information produced in a preceding calculating as the a priori information.

26 Claims, 5 Drawing Sheets

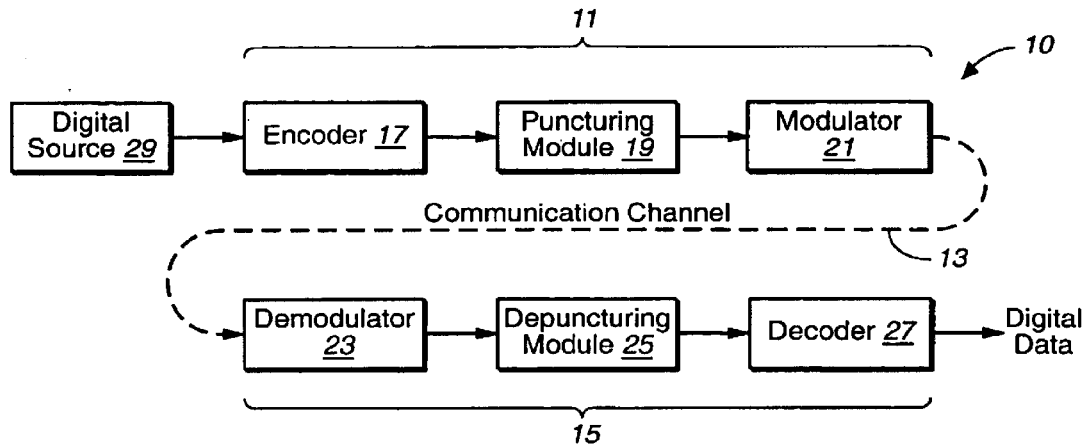
FIG._1
(PRIOR ART)
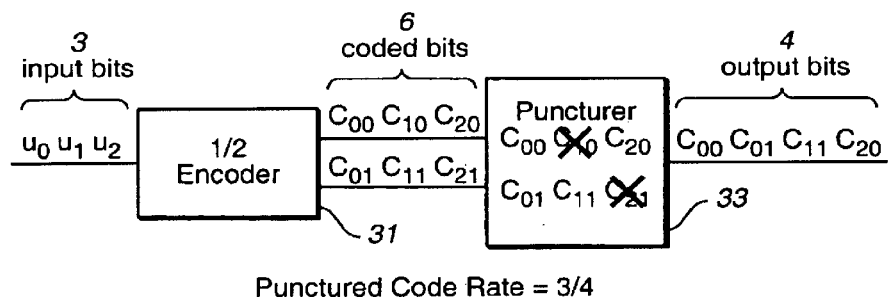
Punctured Code Rate = 3/4
FIG._2
(PRIOR ART)
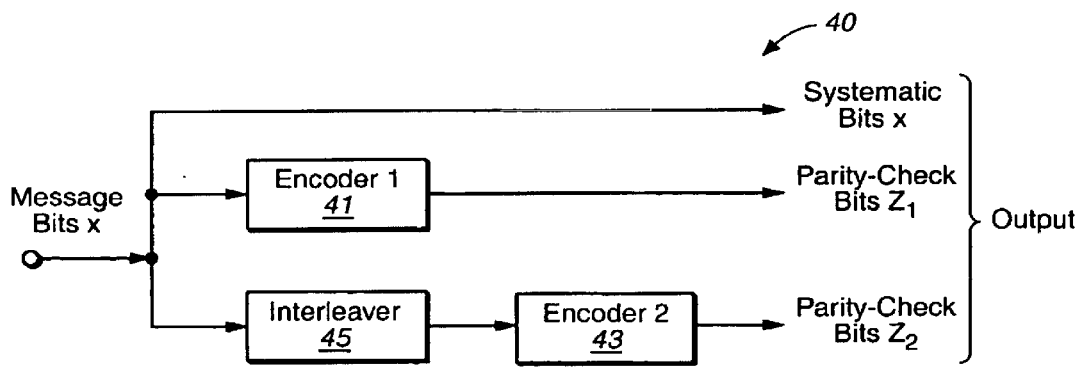
FIG._3
(PRIOR ART)

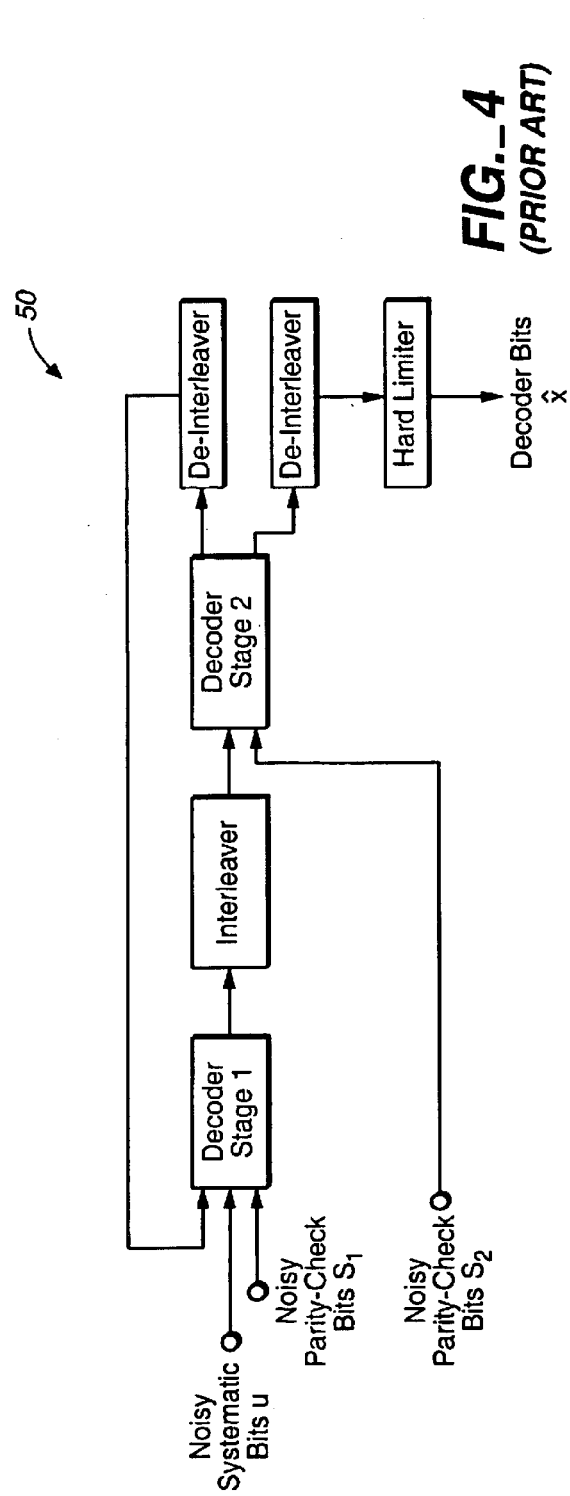
FIG._4 *(PRIOR ART)*
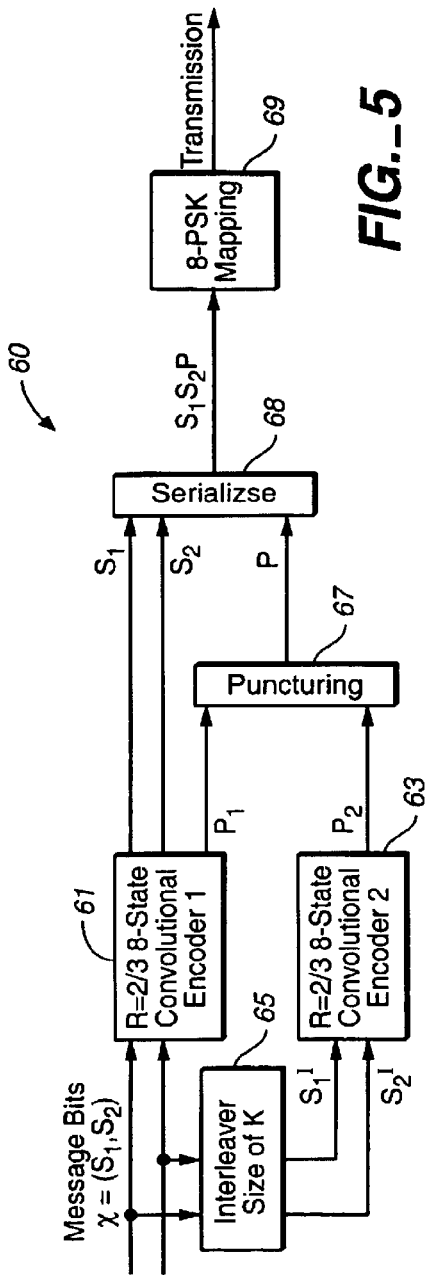
FIG._5

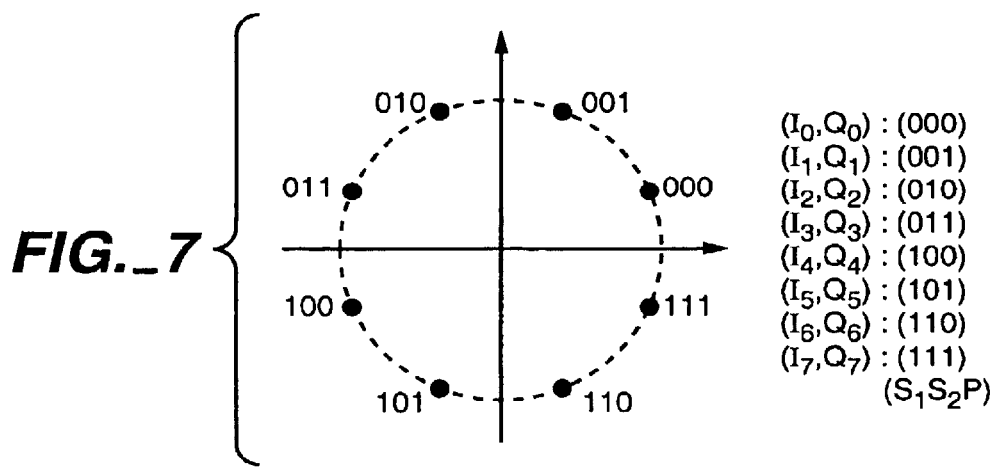
FIG._6
FIG._7
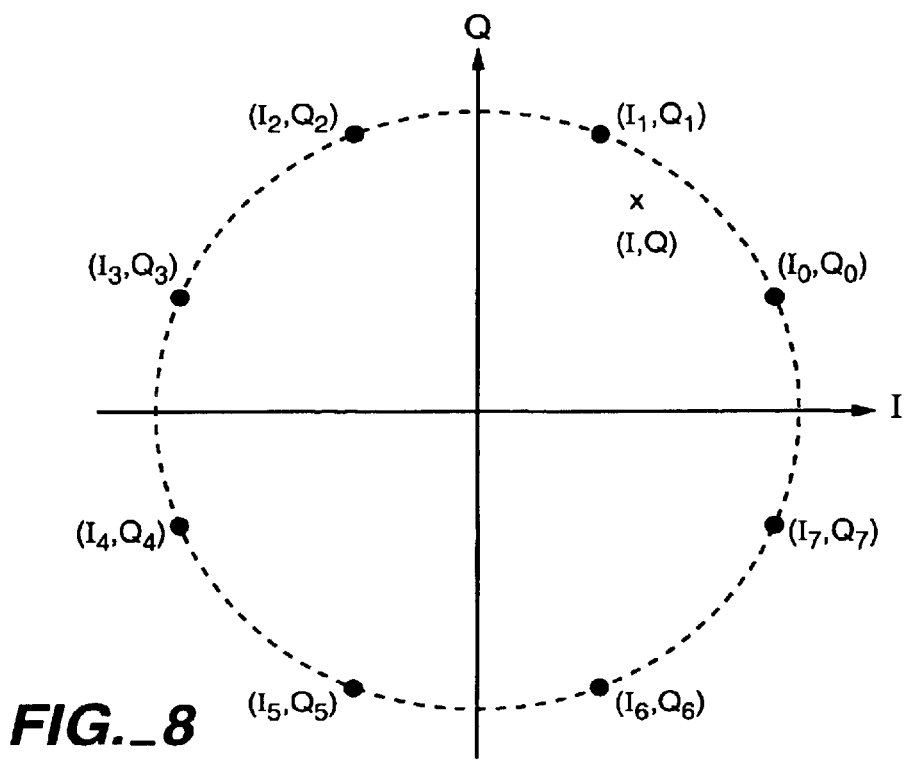
FIG._8

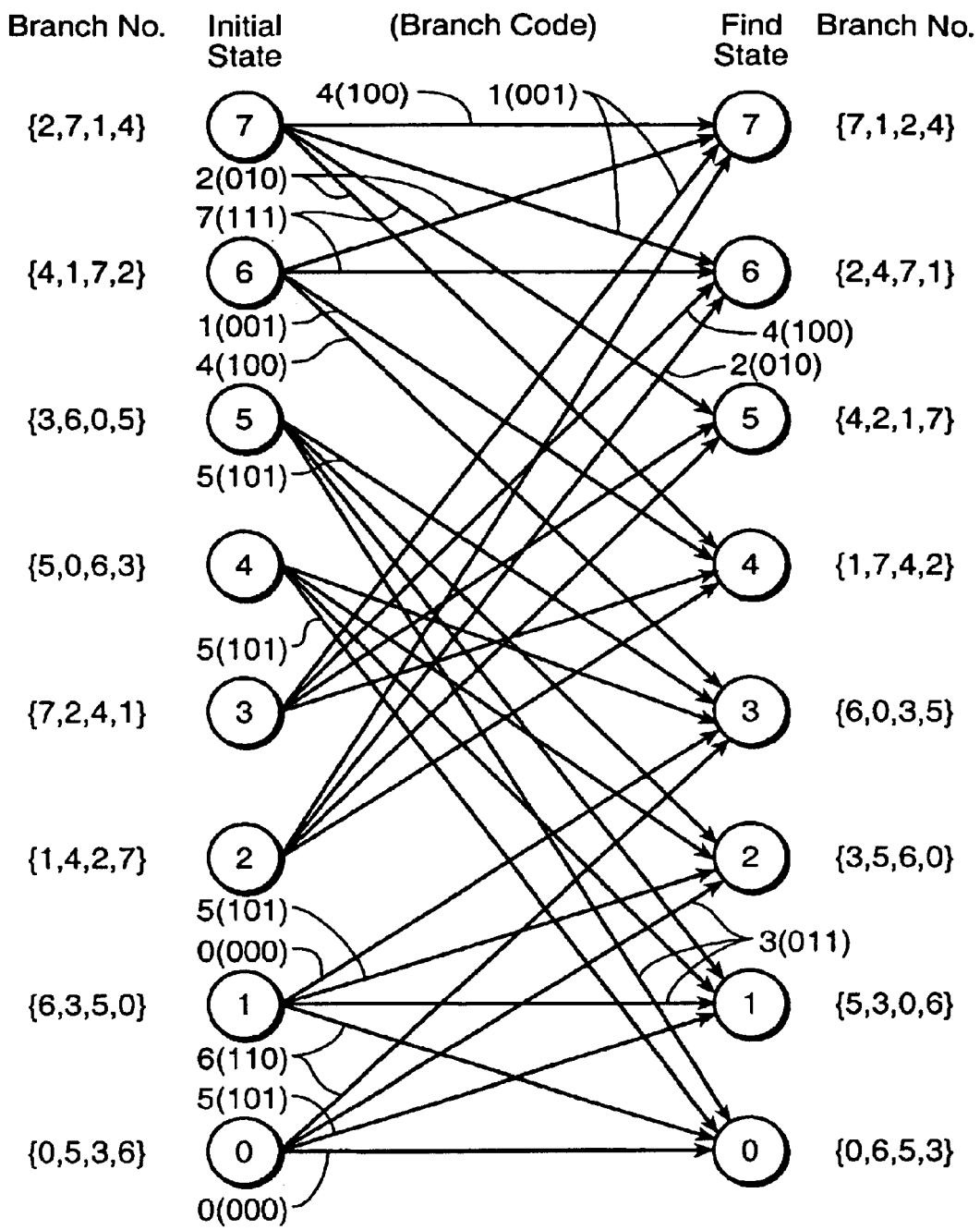
FIG._9

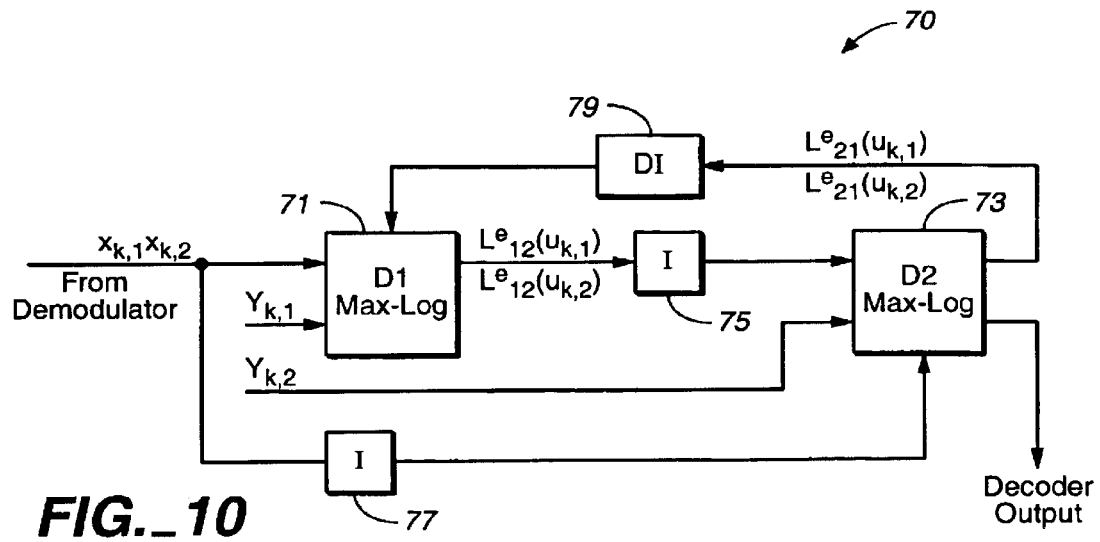
FIG._10
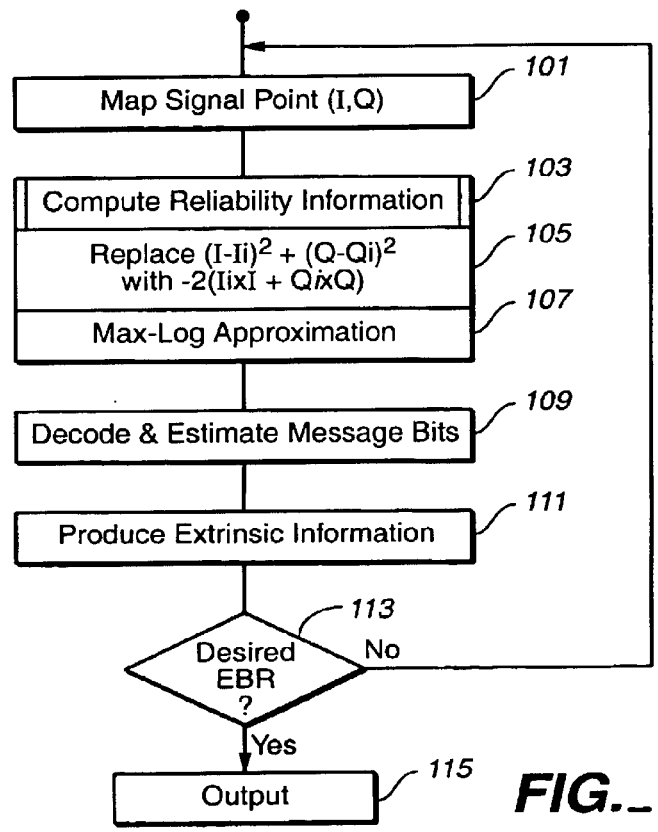
FIG._11

US 6,807,238 B1

METHOD AND APPARATUS FOR DECODING M-PSK TURBO CODE USING NEW APPROXIMATION TECHNIQUE

FIELD OF THE INVENTION

The present invention relates to digital communications systems. More particularly, the present invention relates to a method and apparatus for decoding M-array Phase Shift Keying (M-PSK) turbo code using a new approximation technique.

BACKGROUND OF THE INVENTION

Referring first to FIG. 1, a typical digital communications system 10 has a signal transmission portion 11, a communication channel 13 on a communication medium, and receiving portion 15. The signal transmission portion 11 includes an encoder 17, a puncturing module 19, and a modulator 21. Similarly, the receiving portion 15 includes a demodulator 23, a depuncturing module 25, and a decoder 27. The communication channel 13 used for the transmission may be a microwave radio link, a satellite channel, a digital subscriber loop, or the like.

Digital data, (message bits) from a digital source 29 is received and encoded by the encoder 17 and is then sent to the modulator 21 thorough puncturing module 19. The encoder 17 may be a convolutional encoder. Convolutional encoders are used to encode digital signals so as to maximize the signal to noise ratio (SNR) of the encoded signals when transmitted through a transmission channel or equivalent transmission medium. Convolutional codes include redundant-bits (or parity-check bits) to increase the SNR. This redundancy minimizes the probability of errors introduced during encoding and/or transmission through the communication channel.

A convolutional encoder is defined by the number of coded bits per symbol (CBPS) that it produces, or by its code rate. For example, a rate-1/2 convolutional encoder outputs two bits for every one input bit to generate a stream of convolutional code. It may have 2 CPBS, where it outputs a 2-bit codeword or 2-bit symbol for every input bit. Similarly, a rate-1/n convolutional encoder outputs n bits per one input bit, and a rate-k/n convolutional encoder processes k input bits at a time and outputs n bits for every k input bits.

Such convolutional coding techniques decrease the rate of the signals that may be transmitted over a given bandwidth due to the redundant bits added to the message bits. However, if the channel conditions are favorable, some of the coded output bits may be removed in a systematic way so as to increase the rate of the transmitted bits. This process is called "puncturing." Prior to digital signal transmission, puncturing is typically used to remove redundancy in a codeword.

The puncturing module 19 provides punctured data to the modulator 21. As described above, coded bits are systematically deleted or "punctured" in the puncturing module 19. Puncturing may be performed at various rates with respect to the basic unpunctured code. For example, as shown in FIG. 2, a punctured code rate of 3/4 of a system with a basic rate-2/1 encoder is achieved as follows. A rate-1/2 encoder 31 outputs two coded bits, or a 2-bit codeword ($C_{k0}$, $C_{k1}$) for one input bit ($u_k$). (FIG. 2 shows the situation where k=0, 1, 2.) A puncturer 33 systematically deletes 2 coded bits out of every 3 pairs of coded bits (i.e., out of 6 coded bits), resulting in output of 4 coded bits from the system.

Returning to FIG. 1, the modulator 21 modulates the coded digital data stream onto a carrier signal (typically sinusoidal) to produce a modulated signal. In general, the modulation process making the transmission possible involves switching (keying) the amplitude, frequency, or phase of a sinusoidal carrier in some fashion in accordance with the incoming data. There are three basic signaling schemes, known as amplitude shift keying (ASK), frequency shift keying (FSK), and phase shift keying (PSK). The modulator 21 may be a M-array PSK, in which a codeword is mapped onto a corresponding signal point (massage point) in the M-array PSK signal space (i.e.; M-PSK constellation). The modulated signal includes an in-phase (I) component and a quadrature (Q) component in the signal space.

In the receiving portion 15, the modulated signals are received and demodulated by the demodulator 23, resulting in a stream of symbols. When the transmitted signals are punctured, they must be "de-punctured" before decoding. Thus, the stream of symbols is passed to the depuncturing module 25. The decoder 27 decodes the de-punctured symbols by estimating the original digital data from the symbols, and output the decoded digital signals.

Various approaches have been proposed for the construction of powerful codes structured in such a way that decoding has feasible computational complexity. Turbo coding is one of such coding techniques. FIG. 3 illustrates an encoder 40 of a turbo code in its most basic form. The turbo encoder 40 includes two constituent systematic encoders 41 and 43 joined together by means of an interleaver 45.

An interleaver is an input-output mapping device that permutes the ordering of a sequence of symbols from a fixed alphabet in a completely deterministic manner. That is, it takes the symbols at the input and produces identical symbols at the output but in a different temporal order. The interleaver can be of many types, of which the periodic and pseudo-random are two. Turbo codes use a pseudo-random interleaver, which operates only on the systematic bits.

Typically, but not necessarily, the same code is used for both constituent encoders 41 and 43. The constituent codes recommended for turbo codes are short constraint-length recursive systematic convolutional (RSC) codes. The reason for making the convolutional codes recursive (i.e., feeding one or more of the tap outputs in the sift register back to the input) is to make the internal state of the shift register depend on past outputs. This affects the behavior of the error patterns (a single error in the systematic bits produces an infinite number of parity errors), with the result that a better performance of the overall coding strategy is attained.

In FIG. 2 the input data stream is applied directly to the first encoder 41, and the pseudo-randomly reordered (i.e., interleaved) version of the same data stream is applied to the second encoder 43. The systematic bits (i.e., original message bits) x and the two sets of parity-check bits $z_1$ and $z_2$ generated by the two encoders constitute the output of the turbo encoder 40. Although the constituent codes are convolutional, in reality turbo codes are block codes with the block size being determined by the size of the interleaver.

As discussed above, the parity check bits generated by the two encoders may be punctured prior to data transmission over the channel to maintain a lower code rate. A punctured code is constructed by deleting certain parity check bits, thereby increasing the data rate. However, the use of puncture map is not a necessary requirement of the generation of turbo codes.

FIG. 4 shows the basic structure of a turbo decoder 50. The turbo decoder operates on "noisy" versions of the systematic bits u and the two sets of parity-check bits $\zeta_1$ and $\zeta_2$. The turbo decoder 50 includes two decoding stages to produce an estimate of the original message bits. Each of two decoding stages uses a BCJR algorithm, which was originally developed by Bahl, Cocke Jelinek, and Raviv (hence the name) to solve a maximum a posteriori probability (MAP) detection problem.

The BCJR algorithm is a soft input-soft output decoding algorithm with two recursions, one forward and the other backward, both of which involve soft decisions. The BCJR algorithm is a MAP decoding in which the bit errors are minimized by estimating the a posteriori probabilities of the individual bits in a code word. That is, to reconstruct the original data sequence, the soft outputs of the BCJR algorithm are hard-limited.

In the case where the transmitted signal has been modulated with M-array PSK, the received signal also has an in-phase (I) component and a quadrature (Q) component. Thus, in the receiver end, a demodulator will generate an (I, Q) pair for each received signal point. In order to use a binary turbo code decoder, therefore, probability information for each of the received bits has to be extracted from the (I,Q) pair of the received signal point. Such probability information requires calculation of Euclidian distance $d_i$ between the received signal point and the message points $(I_i, Q_i)$ in M-array PSK constellation (for i=0, 1, . . . M−1). Typically, for an additive white Gaussian noise (AWGN) channel, such probability information is expressed by reliability information R defined by $$R = \log\left[\left(\sum_i \exp\left(-\frac{E_s}{N_0}((I-I_i)^2 + (Q-Q_i)^2)\right)\right) \bigg/ \left(\sum_j \exp\left(-\frac{E_s}{N_0}((I-I_j)^2 + (Q-Q_j)^2)\right)\right)\right]$$

where i is summation for subset of M, and j is summation for another subset of M.

However, in VLSI implementation, calculation of Euclidian distance, as well as calculation of exponential and logarithm functions, is complicated and expensive operation. Therefore, there is a need for simplifying computation in turbo decoders in decoding PSK symbols.

BRIEF DESCRIPTION OF THE INVENTION

The method of the present invention decodes a received symbol representing data bits including message bits and parity-check bits. The method comprising (a) mapping the symbol onto a received signal point in a signal space, the signal point having an in-phase component (I) and a quadrature phase component (Q) in the signal space; (b) computing reliability information for each data bit, the reliability information associated with a distance $d_i = \sqrt{(I-I_i)^2 + (Q-Q_i)^2}$ between the received signal point (I, Q) and a reference constellation point $(I_i, Q_i)$ in the signal space, where i=0, 1, . . . , M−1 (for M an integer), by replacing calculation of $(I-I_i)^2 + (Q-Q_i)^2$ with calculation of $-2(I_i \times I + Q_i \times Q)$; (c) decoding the received symbol using the reliability information and a priori information to produce estimated message bits, the a priori information having a predetermined value in a first decoding; (d) calculating difference between received message bits and the estimated message bits to produce extrinsic information of estimated message bits; and (e) repeating at least once the mapping, computing, decoding and calculating, using the extrinsic information produced in a preceding calculating as the a priori information.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1 is a block diagram schematically illustrating a typical digital communications system.

FIG. 2 is a diagram schematically illustrating a system having a punctured code rate of 3/4 using a basic rate-1/2 encoder.

FIG. 3 is a diagram schematically illustrating a turbo code encoder in a most basic form.

FIG. 4 is a diagram schematically illustrating a basic structure of a typical turbo decoder.

FIG. 5 is a block diagram schematically illustrating an example of a parallel turbo code encoder according to a presently preferred embodiment of the present invention.

FIG. 6 is a diagram illustrating puncture patterns for the variable rate turbo encoder according to a presently preferred embodiment of the present invention.

FIG. 7 is a diagram illustrating an example of the 8-PSK constellation using one of the Ungerboeck codes.

FIG. 8 is a diagram illustrating mapping of a received symbol onto a received signal point in an 8-PSK signal space.

FIG. 9 is a diagram illustrating Trellis structure of R=2/3, 8-state convolutional code used in the turbo decoder according to a presently preferred embodiment of the present invention.

FIG. 10 is a block diagram schematically illustrating a parallel turbo code decoder according to a presently preferred embodiment of the present invention.

FIG. 11 is a process flow diagram schematically illustrating the operation of the parallel turbo code decoder according to a presently preferred embodiment of the present invention.

DETAILED DESCRIPTION

Embodiments of the present invention are described herein in the context of a method and apparatus for decoding M array-PSK turbo code using a new approximation technique. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

FIG. 5 illustrates an example of a parallel turbo code encoder 60 for producing a turbo code according to a presently preferred embodiment of the present invention. The turbo code encoder 60 comprises two constituent convolutional encoders 61 and 63 concatenated in parallel, an interleaver 65, a puncturing module 67, a serializer 68, and a modulator (8-PSK mapper) 69.

The encoders 61 and 63 are rate-2/3, 8-state recursive systematic convolutional (RSC) encoders, with the octal generator matrix:

$$G_{2\times 3} = \begin{bmatrix} 1 & 0 & (D^3+D^2)/(D^3+D+1) \\ 0 & 1 & (D^3+D^2+D+1)/(D^3+D+1) \end{bmatrix} \quad (1)$$

where D is the delay variable. Each entry of the third column of the matrix $G_{2\times 3}$ is the transfer function of the feedback shift register in the respective convolutional encoder, as is well understood by those having ordinary skill in the art. The transfer function is defined as the transform of the output divided by the transform of the input, as is known to those having ordinary skill in the art.

The first encoder 61 encodes an, input message bit stream (message bits pair $x=(S_1, S_2)$, and outputs a systematic bit stream (systematic bits pair $x=(S_1, S_2)$, i.e., the same as the message bits pair) and a parity-check bit stream (parity-check bit: $P_1$). The systematic bit stream is fed to the seriarizer 68, and the parity-check bit stream is fed to the puncturing module 67.

The input message bit stream is interleaved by the interleaver 65. The bit interleaver 65 has a size (length) of K. According to a presently preferred embodiment of the present invention, the length K is 10,240. The interleaved message bits $x^I=(S_1^I, S_2^I)$ are input to the second encoder 63. The second encoder 63 operates on the interleaved message bits in the same manner as the first encoder 61. The parity-check bit stream output from the second encoder 63 is fed to the puncturing module 67. The output systematic bit stream from the second encoder 63 is discarded, since it has no additional information on the signal.

The variable rate of the turbo encoder 60 is achieved by an appropriate puncturing of the parity bits $P_1$ and $P_2$ by the puncturing module 67. FIG. 6 illustrates the puncture patterns for the variable rate (2/3, 5/6, and 8/9) turbo encoder.

The serializer 68 arranges the outputs from the first encoder 61 and puncturing module 67, and produces an output stream of coded bits, for example, ($S_1$ $S_2$ P) for a code rate of 2/3. The parity bit P is $P_1$ or $P_2$ according to the puncture pattern. The modulator (8-PSK mapper) 69 maps the output bits (3-bit symbols in this example) onto corresponding signal points in the 8-PSK constellation and produces the modulated signals accordingly. FIG. 7 illustrates an example of the 8-PSK constellation using one of the Ungerboeck codes.

As discussed above, the MAP algorithm for trellis codes was proposed simultaneously by Bahl, Cocke, Jelinek, and Raviv, and the BJCR algorithm was adopted to systematic convolutional codes. Here we will show how the MAP decoder uses log-likelihood values and that its output has the general structure.

For trellis of binary feedback convolutional code, let $S_k$ be the encoder state at time k. The bit $u_k$ is associated with the transition from time k−1 to time k. The trellis states at level (time) k−1 and at level (time) k are indexed by the integer s' and s, respectively. The goal of the MAP algorithm is to provide us with the log-likelihood ratio $L(u_k)$:

$$L(u_k) = \log \frac{P(u_k=1|y)}{P(u_k=-1|y)} \quad (2)$$

$$= \log \frac{\sum_{\substack{(s',s) \\ u_k=-1}} p(s',s,y)/p(y)}{\sum_{\substack{(s',s) \\ u_k=1}} p(s',s,y)/p(y)}$$

$$= \log \frac{P(y|u_k=1)}{P(y|u_k=-1)} + \log \frac{P(u_k=1)}{P(u_k=-1)}$$

where the second term:

$$\log \frac{P(u_k=1)}{P(u_k=-1)}$$

represents a priori information.

Since $P(u_k=1)=P(u_k=-1)$ typically, the a priori information term is usually zero for conventional decoders. The index pair s' and s determine the information bits (message bits) $u_k$ and the coded bits (parity-check bits or redundant bits) $u_{k,v}$, for v=2, ..., n. The sum of the joint probabilities p(s',s,y) in the numerator or in the denominator is taken over all existing transitions from state s' to state s labeled with the information bit $u_k=+1$, or with the information bit $u_k=-1$, respectively. Assuming a memoryless transition channel, the joint probability p(s',s,y) can be written as the product of three independent probabilities:

$$p(s',s,y) = p(s', y_{j<k}) \times p(s, y_k|s') \times p(y_{j>k}|s) \quad (3)$$

$$= p(s', y_{j<k}) \times P(s|s')p(y_k|(s',s)) \times p(y_{j>k}|s)$$

$$= \alpha_{k-1}(s') \times \gamma_k(s',s) \times \beta_k(s)$$

Here $y_{j<k}$ denotes the sequence of received symbols $y_j$ from the beginning of the trellis up to time k−1 and $y_{j<k}$ denotes the corresponding sequence from time k+1 up to the end of the trellis. The forward recursion of the MAP algorithm yields the forward estimation α of state probabilities:

$$\alpha_k(s) = \sum_{s'} \alpha_{k-1}(s') \times \gamma_k(s',s) \quad (4)$$

Similarly, the backward recursion yields the backward estimation β of state probabilities:

$$\beta_{k-1}(s') = \sum_s \gamma_k(s',s) \times \beta_k(s) \quad (5)$$

In order to perform the optimum "symbol-by-symbol" MAP rule, the trellis has to be of finite duration. We assume that at the start and at the end of the observed sequence all paths merge at the zero state. Then the forward and backward recursion are initialized with $\alpha_{start}(0)=1$ and $\beta_{end}(0)=1$.

Whenever a transition between s' and s exists, the branch transition probabilities γ are given by $$\gamma_k(s',s) = p(y_k u_k) \times P(u_k) \quad (6)$$

where the event $u_k$ corresponds to the event s'→s.

Defining the log-likelihood ratio of a priori probabilities, i.e., $$L^e(u_k) = \log \frac{P(u_k = 1)}{P(u_k = -1)} \quad (7)$$

observes that we may write $$P(u_k = \pm 1) = \frac{e^{\pm L^e(u_k)}}{1 + e^{\pm L^e(u_k)}} = \frac{e^{-\frac{L^e(u_k)}{2}}}{1 + e^{-L^e(u_k)}} \times e^{\frac{L^e(u_k) u_k}{2}} = A_k \times e^{\frac{L^e(u_k) u_k}{2}} \quad (8)$$

In a similar way, the conditioned probability $p(y_k|u_k)$ for systematic convolutional code can be written as $$p(y_k|u_k) = B_k \times \exp\left(\frac{L_c y_{k,1} u_k}{2} + \frac{\sum_{v=2}^{n} L_c y_{k,v} u_{k,v}}{2}\right) \quad (9)$$

Keep in mind that some of the coded bits might be punctured before transmission, in which case the sum in the above equation is only over those indices v corresponding to nonpunctured coded bits. The term $A_k$ and $B_k$ in above equations are equal for all transitions from level k−1 to level k and hence will cancel out in the ratio of $L(u_k)$. Therefore, the branch transition operation to be used for $\alpha_k(s)$ and $\beta_k(s)$ reduces to the expression $$\exp\left(\frac{u_k(L_c y_{k,1} + L^e(u_k))}{2}\right)(\gamma_k^{(e)}(s',s)) = \gamma_k(s',s) \quad (10)$$

with $$\gamma_k^{(e)}(s',s) = \exp\left(\frac{\sum_{v=2}^{n} L_c y_{k,v} u_{k,v}}{2}\right) \quad (11)$$

Then we have $$L(u_k) = L_c y_{k,1} + L^e(u_k) + \log \frac{\sum_{\substack{(s',s) \\ u_k=1}} \gamma_k^{(e)}(s'',s) \times \alpha_{k-1}(s') \times \beta_k(s)}{\sum_{\substack{(s',s) \\ u_k=1}} \gamma_k^{(e)}(s'',s) \times \alpha_{k-1}(s') \times \beta_k(s)} \quad (12)$$

where $L_c$ is a constant proportional to the received SNR. For an AWGN channel, $$L_c = \frac{4E_s}{N_0},$$

where $E_s$ is, the energy per code bit and $N_0/2$ is the power spectral density of AWGN. The first term is sometimes called the channel value. The second term represents any a priori information about $u_k$ provided by a previous decoder or decoding stage, and the third term represents extrinsic information that can be passed on to a subsequent decoder or decoding stage.

If we take natural logarithm on above equation (10) with (11), then we have $$\log \gamma_k(s',s) = \frac{u_k(L_c y_{k,1} + L^e(u_k))}{2} + \frac{\sum_{v=2}^{n} L_c y_{k,v} u_{k,v}}{2} \quad (13)$$

As is seen from the above equations, calculation of $L(\hat{u}_k)$, p(s', s, y), $\alpha_{k-1}(s')$, $\beta_k(s)$, and $\gamma_k(s', s)$ involves calculating exponential and logarithm functions. In VLSI implementation, such calculation is very expensive operation.

Thus, in calculation of $L(\hat{u}_k)$, p(s',s,y), $\alpha_k(s)$, $\beta_{k-1}(s')$, $\gamma_k(s',s)$, we use the following approximation techniques called Max-Log operation:

$$\log(e^{x_1} + e^{x_2}) = \max(x_1, x_2) + \log(1 + e^{-|x_2 - x_1|}) = \max(x_1, x_2) + f(x_1, x_2) \quad (14)$$

where $f(x_1, x_2) = f(|x_1 - x_2|)$ is a correction function.

The Max-Log approximation simplify the operation and makes it easy to perform the calculation of the various log-likelihood values.

Applying the Max-Log algorithm to calculation of $L(\hat{u}_k)$, p(s',s,y), $\alpha_{k-1}(s')$, $\beta_k(s)$, and $\gamma_k(s', s)$ in the right hand side of the above Equations (4) and (5) yields:

$$\log(\alpha_k(s)) = \log\left(\sum_{s'} e^{\log(\alpha_{k-1}(s')) + \log(\gamma_k(s',s))}\right) = \quad (15)$$

$$\max_{(s')}(\overline{\alpha}_{k-1}(s') + \overline{\gamma}_k(s',s)) + f_\alpha(x)$$

and $$\log(\beta_{k-1}(s')) = \quad (16)$$

$$\log\left(\sum_{s} e^{\log(\beta_k(s)) + \log(\gamma_k(s',s))}\right) = \max_{(s)}(\overline{\gamma}_k(s',s) + \overline{\beta}_k(s)) + f_\beta(x)$$

where $\overline{\alpha}_{k-1}(s') = \log(\alpha_{k-1}(s'))$, $\overline{\beta}_k(s) = \log(\beta_k(s))$, and $\overline{\gamma}_k(s',s) = \log(\gamma_k(s',s))$.

Thus, by summing the Equation (3) with respect to s and s', $$\sum_{\substack{(s,s') \\ u_k=1}} p(s',s,y) = \quad (17)$$

$$\sum_{\substack{(s,s') \\ u_k=1}} \alpha_{k-1}(s') \times \beta_k(s) \times \gamma_k(s',s) = \sum_{\substack{(s,s') \\ u_k=1}} e^{\log(\alpha_{k-1}(s')) + \log(\beta_k(s)) + \log(\gamma_k(s',s))}$$

Similarly, $$\sum_{\substack{(s,s') \\ u_k=-1}} p(s',s,y) = \sum_{\substack{(s,s') \\ u_k=-1}} \alpha_{k-1}(s') \times \beta_k(s) \times \gamma_k(s',s) = \quad (18)$$

$$\sum_{\substack{(s,s') \\ u_k=-1}} e^{\log(\alpha_{k-1}(s')) + \log(\beta_k(s)) + \log(\gamma_k(s',s))}$$

Then, $$L(\hat{u}_k) = \max_{(u_k=1)}(\overline{\alpha}_{k-1}(s') + \overline{\beta}_k(s) + \overline{\gamma}_k(s',s)) - \max_{(u_k=-1)}(\overline{\alpha}_{k-1}(s') + \overline{\beta}_k(s) + \overline{\gamma}_k(s',s)) \quad (19)$$

When the transmitted signal is modulated with M-array PSK, each symbol or codeword is mapped into a M-array PSK signal point. For example, for 8-PSK, a 3-bit symbol ($S_1S_2P$) is mapped onto one of the signal points ($I_i$, $Q_i$) for i=0, 1, ..., 7 in the 8-PSK constellation, as shown in FIG. 7. The received signal also has an in-phase (I) component and a quadrature (Q) component in the signal space. In the receiver end, a demodulator generates an (I, Q) pair for each received signal point. However, due to the noise (typically AWGN) added to the signal during the transmission, the location of the received signal point (I, Q) is not the same as the location of the original message point (one of the constellation points ($I_i$, $Q_i$)) in the, signal space, as shown in FIG. 8.

In order to estimate the message bits using a binary turbo code decoder, probability information for the received bits is extracted from the received signal point (I,Q). Typically, such probability information is expressed by reliability information R associated with Euclidian distance $d_i = \sqrt{(I-I_i)^2+(Q-Q_i)^2}$ between said received signal point (I, Q) and a reference constellation point ($I_i$, $Q_i$) in the signal space. The reliability information R is defined by:

$$R = \log\left(\left(\sum_i \exp\left(-\frac{E_s}{N_0}((I-I_i)^2 + (Q-Q_i)^2)\right)\right) \middle/ \left(\sum_j \exp\left(-\frac{E_s}{N_0}((I-I_j)^2 + (Q-Q_j)^2)\right)\right)\right) \quad (20)$$

where symbol energy is $E_s$, additive white Gaussian noise has zero mean and power spectral density $$\frac{N_0}{2},$$

i is summation for subset of M, and j is summation for another subset of M.

According to a presently preferred embodiment of the present invention, in the calculation of the reliability information R, calculation of $(I-I_i)^2+(Q-Q_i)^2$ is replaced with calculation of $-2(I_i \times I + Q_i \times Q)$, where i=0, 1, ..., M-1 for M-array PSK. This replacement simplify the computation of the distance between two signal points in the M-PSK constellation. In addition, when this technique is combined with the Max-Log approximation, calculation of the reliability information is further simplified, as described below.

According to a presently preferred, embodiment of the present invention, an Ungerboeck. code is used for the 8-PSK mapping. For the 8-PSK mapping shown in FIG. 7, the reliability information ($R_1$, $R_2$, $R_3$) for each symbol ($S_1$, $S_2$, P) is extracted from the (I, Q) pair as follows (where $S_1$ and $S_2$ are message bit, and the parity-check bit P is $P_1$ or $P_2$ according to the punctuation pattern):

$$R_1 = \log\left(\left(\sum_{i=0,1,2,3} \exp\left(-\frac{E_s}{N_0}((I-I_i)^2 + (Q-Q_i)^2)\right)\right) \middle/ \left(\sum_{j=4,5,6,7} \exp\left(-\frac{E_s}{N_0}((I-I_j)^2 + (Q-Q_j)^2)\right)\right)\right) \quad (21)$$

$$R_2 = \log\left(\left(\sum_{i=0,1,4,5} \exp\left(-\frac{E_s}{N_0}((I-I_i)^2 + (Q-Q_i)^2)\right)\right) \middle/ \left(\sum_{j=2,3,6,7} \exp\left(-\frac{E_s}{N_0}((I-I_j)^2 + (Q-Q_j)^2)\right)\right)\right) \quad (22)$$

$$R_3 = \log\left(\left(\sum_{i=0,2,4,6} \exp\left(-\frac{E_s}{N_0}((I-I_i)^2 + (Q-Q_i)^2)\right)\right) \middle/ \left(\sum_{j=1,3,5,7} \exp\left(-\frac{E_s}{N_0}((I-I_j)^2 + (Q-Q_j)^2)\right)\right)\right) \quad (23)$$

It should be noted that in Equation (21) the summation for i=0, 1, 2, 3 in the numerator is for the signal points having "0" for its first (most significant) bit, i.e., $S_1$ component of the symbol, and the summation for j=4, 5, 6, 7 in the denominator is for the signal points having "1" for the $S_1$ component. Thus, the reliability information $R_1$ corresponds to the probability or reliability of the $S_1$ component, where a positive number indicates probability that $S_1$ is "0", and a negative number indicates that $S_1$ is "1". If the received symbol is equally probable to have "0" or "1" for its $S_1$ component, the reliability information $R_1$ will be zero.

Similarly, in Equation (22), the summation for i=0, 1, 4, 5 is for the signal points having "0" for its $S_2$ component, and the summation for j=2, 3, 6, 7 is for the signal points having "1" for the $S_2$ component, and thus the reliability information $R_2$ corresponds to the probability or reliability of the $S_2$ component of the received signal. Similarly, in Equation (23), the summation for i=0, 2, 4, 6 is for the signal points having "0" for its P component, and the summation for j=1, 3, 5, 7 is for the signal points having "1" for the P component, and thus the reliability information $R_3$ corresponds to the probability or reliability of the P component of the received signal.

The signal point (I, Q) output from demodulator will be represented by 2's complement 7-bits.

In calculation of the reliability information ($R_1$, $R_2$, $R_3$), calculation of $(I-I_i)^2+(Q-Q_i)^2$ is replaced with calculation of $-2(I_i \times I + Q_i \times Q)$. In the calculation of $(I-I_i)^2+(Q-Q_i)^2 = I^2 + I_i^2 + Q^2 + Q_i^2 - 2(I_i \times I + Q_i \times Q)$ for a given received signal point (I, Q), ($I^2+Q^2$) is a constant corresponding to the received symbol energy, and ($I_i^2+Q_i^2$) is also a constant corresponding to the transmitted symbol energy for all constellation points ($I_i$, $Q_i$). Thus, these constant values are omitted in the calculation.

Then, the Max-Log approximation is applied to the calculation of the reliability information. For example, for the reliability information $R_1$, $$\log\left(\sum_{i=0,1,2,3} \text{Exp}(X_i)\right) - \log\left(\sum_{j=4,5,6,7} \text{Exp}(X_j)\right) \approx \quad (24)$$

$$\text{maxlog}(X_0, X_1, X_2, X_3) - \text{maxlog}(X_4, X_5, X_6, X_7)$$

where $\max\log(X_0, X_1) = \max(X_0, X_1) + f(X_0, X_1)$, and $f(X)$ is the correction term, and $$\log\left(\sum_{i=0,1,2,3} \text{Exp}(X_i)\right) \approx \text{maxlog}(X_0, X_1, X_2, X_3) \quad (25)$$

$$= \max\{\max(X_0, X_1), \max(X_2, X_3)\} + f(S, T)$$

where $S = f(X_0, X_1)$, and $T = f(X_2, X_3)$.

Therefore, the calculation of the reliability information ($R_1$, $R_2$, $R_3$) is replaced by the following equations:

$R_1 = \text{maxlog}_{(i)}(2 \times E_s \times (I_i \times I + Q_i \times Q)) - \max \log_{(j)}(2 \times E_s(I_j \times I + Q_j \times Q))$ for i=0, 1, 2, 3 and j=4, 5, 6, 7. (26)

$R_2 = \text{maxlog}_{(i)}(2 \times E_s \times (I_i \times I + Q_i \times Q)) - \max \log_{(j)}(2 \times E_s(I_j \times I + Q_j \times Q))$ for i=0, 1, 4, 5 and j=2, 3, 6, 7. (27)

$R_3 = \text{maxlog}_{(i)}(2 \times E_s \times (I_i \times I + Q_i \times Q)) - \max \log_{(j)}(2 \times E_s(I_j \times I + Q_j \times Q))$ for i=0, 2, 4, 6 and j=1, 3, 5, 7. (28)

Dividing $R_1$, $R_2$, $R_3$ by 100 will be resulted in 7-bit representation of $R_1$, $R_2$, $R_3$.

FIG. 9 illustrates Trellis structure of R=2/3, 8-state convolutional code used in the turbo decoder. For the first convolutional decoder, each branch is labeled by ($S_1$, $S_2$, $P_1$), and, for the second convolutional decoder, each branch is labeled by ($S_1'$, $S_2'$, $P_2'$). In the transmission portion, for example, in R=2/3, 8-state convolutional code case, the transmitter transmits an 8-PSK signal with input bit sequence $I_1$, $I_2$, $I_3$, ... $I_{10240}$, $P_{1,1}$, $P_{1,3}$, $P_{1,5}$, ..., $P_{1,2559}$, $T_1$, $T_2$, $P_{2,2}$, $P_{2,4}$, $P_{2,6}$, ..., $P_{2,2560}$, $T_3$, $T_4$, where $I_k$ denotes messages bits, $P_{v,m}$ (for v=1 or 2) denotes the corresponding parity-check bits, and $T_n$ denotes padding bits. Therefore, at the receiving portion, the received bit sequence is rearranged for each decoder so that it corresponds to the reliability information sequence ($R_1$, $R_2$, $R_3$) for each decoder.

The relationship between the channel value $L_c y$ and the reliability information $R_v$ is as follows. The MAP decoding method described above is based on a binary turbo code with BPSK modulation. Therefore, the value of a received symbol in Equation (2) is the value of a received BPSK symbol y. However, in the 8-PSK modulated binary turbo code, the reliability information R is extracted from a received 8-PSK signal value $y_{k,v}$, rather than the received BPSK signal value y. If we use reliability information at a BPSK modulated binary turbo decoder instead of 8-PSK; we have following reliability information R:

$$R = \log \frac{e^{-\frac{E_s}{N_0} \times (y-1)^2}}{e^{-\frac{E_s}{N_0} \times (y+1)^2}} = 4 \times \frac{E_s}{N_0} y \qquad (29)$$

For 8-PSK, let ($r_x$, $r_y$) be an in-phase and quadrature value of a received 8-PSK symbol, and let ($I_i$, $Q_i$) be that of 8-PSK signal points (i=0, 1, ... 7). Then, as described above, the reliability information ($R_1$, $R_2$, $R_3$) is given as follows:

$R_1$=maxlog$_{(i)}$($2 \times E_s \times (I_i \times I + Q_i \times Q)$)−max log$_{(j)}$($2 E_s (I_j \times I + Q_j \times Q)$) for i=0,1, 2, 3 and j=4, 5, 6, 7. (30)

$R_2$=maxlog$_{(i)}$($2 \times E_s \times (I_i \times I + Q_i \times Q)$)−max log$_{(j)}$($2 \times E_s (I_j \times I + Q_j \times Q)$) for i=0, 1, 4, 5 and j=2, 3, 6, 7. (31)

$R_3$=maxlog$_{(i)}$($2 \times E_s \times (I_i + Q_i \times Q)$)−max log$_{(j)}$($2 \times E_s (I_j \times I + Q_j \times Q)$) for i=0, 2, 4, 6 and j=1, 3, 5, 7. (32)

Therefore, if we use the reliability information instead of the received signal value, $L_c y$ will be replaced by the reliability information ($R_1$, $R_2$, $R_3$). Then we have a following equation for log $\gamma_k(s',s)$:

$$\log \gamma_k(s', s) = \frac{u_{k,1}(R_1 + L^e(u_{k,1}))}{2} + \frac{u_{k,2}(R_2 + L^e(u_{k,2}))}{2} + \frac{u_{k,3}(R_3)}{2} \qquad (33)$$

The value of a received bit $u_i$ for i=1, 2, 3 is also replaced by ($S_1$, $S_2$, $P_{1 \text{ or } 2}$).
Then we have $$\log \gamma_k(s', s) = \frac{S_{k,1}(R_1 + L^e(S_{k,1}))}{2} + \frac{S_{k,2}(R_2 + L^e(S_{k,2}))}{2} + \frac{P_{k,1or2}(R_3)}{2} \qquad (34)$$

After the value of log $\gamma_k$(s',s) for each branch is calculated, the values of $\overline{\alpha}_k(s)$, $\overline{\beta}_{k-1}(s')$ are calculated for each state, and then L($u_{k,1}$), L($u_{k,2}$) for each k are computed.

FIG. 10 schematically illustrates a parallel turbo code decoder 70 according to a presently preferred embodiment of the present invention. The turbo decoder 70 includes a first decoder 71, a second decoder 73, a first interleaver 75, a second interleaver 77, and a deinterleaver 79. The turbo decoder 70 receives systematic bits $X_{k,1}$, $X_{k,2}$ and parity-check bits $Y_{k,1}$ or $Y_{k,2}$ (depending on the punctuation pattern) from a demodulator (not shown) at time k. Received signal value ($X_{k,1}$, $X_{k,2}$, $Y_{k,1 \text{ or } 2}$) corresponds to the transmitted signal ($S_{k,1}$, $S_{k,2}$, $P_{k, 1 \text{ or } 2}$), but includes the noise added during transmission.

FIG. 11 schematically illustrates decoding operation in the turbo decoder 70. The first decoder 71 receives message bits $X_{k,1}$, $X_{k,2}$, and a parity-check bit $Y_{k,1}$ output from the demodulator. The received symbol representing ($X_{k,1}$, $X_{k,2}$, $Y_{k,1}$) is mapped onto a received signal point (I, Q) in a signal space (101).

Then, the reliability information ($R_1$, $R_2$, $R_3$) is calculated from the obtained value (I, Q), as described above (103). In this calculation, calculation of $(I-I_i)^2+(Q-Q_i)^2$ is replaced with calculation of $-2(I_i \times I + Q_i \times Q)$ (105), and the Max-Log approximation is used as shown in Equations (30) to (32) (107).

The first decoder 71 decodes the received symbol using the reliability information ($R_1$, $R_2$, $R_3$) and a priori information, and produces estimated message bits (109). The a priori information is set to be a predetermined value for the first decoding at the first decoder 71. For example, when a message bit (in a random sequence) is first received, it may be equally likely to be "0" or "1", and a priori information for the receive bit may be set zero. The Max-Log approximation described above is used in calculating the various values to produce the estimated message bits. The first decoder 71 then calculates difference between the received message bits and the estimated message bits, so as to produce the extrinsic information of the message bits (111). The extrinsic information is expressed in log-likelihood of the message bits, and used as a priori information at the next decoding stage in the second decoder 73. The operations are iterated until a required or desired bit error rate (BER) is achieved (113). Then, when such a BER is achieved, a final decoder output is output from the turbo decoder 70 (115). The more detailed algorithm and computing process performed in the decoder are as follows.

After calculating the reliability information ($R_1$, $R_2$, $R_3$), compute log $\gamma_k$(s',s) using Equation (34) above:

$$\log \gamma_k(s', s) = \frac{S_{k,1}(R_1 + L^e(S_{k,1}))}{2} + \frac{S_{k,2}(R_2 + L^e(S_{k,2}))}{2} + \frac{P_{k,1or2}(R_3)}{2} \qquad (35)$$

Then compute a posteriori log likelihood by forward recursion, log($\alpha_k$(s)) as $$\log(\alpha_k(s)) = \log\left(\sum_{s'} e^{\log(\alpha_{k-1}(s'))+\log(\gamma_k(s',s))}\right) = \qquad (36)$$

$$\max_{(s')}(\overline{\alpha}_{k-1}(s') + \overline{\gamma}_k(s', s)) + f_\alpha(x)$$

where $\overline{\alpha}_{k-1}$(s')=log($\alpha_{k-1}$(s')), $\overline{\gamma}_k$(s',s)=log($\gamma_k$(s',s)), and $f_\alpha$(x) is a correction function.

Compute a posteriori log likelihood with back word recursion, log($\beta_{k-1}$(s')) as $$\log(\beta_{k-1}(s')) = \quad (37)$$

$$\log\left(\sum_s e^{\log(\beta_k(s))+\log(\gamma_k(s',s))}\right) = \max_{(s)}(\overline{\gamma}_k(s',s) + \overline{\beta}_k(s)) + f_\beta(x)$$

where $\overline{\beta}_k(s)=\log(\beta_k(s))$, $\overline{\gamma}_k(s',s)=\log(\gamma_k(s',s))$, and $f_\beta(x)$ is a correction function.

Then compute the log likelihood of the message bits $u_{k,1}$ and $u_{k,2}$ as $$L(u_{k,1})=\max_{(u_{k,1}=1)}(\overline{\alpha}_{k-1}(s')+\overline{\beta}_k(s)+\overline{\gamma}_k(s,s))-\max_{(u_{k,1}=-1)}(\overline{\alpha}_{k-1}(s')+\overline{\beta}_k(s')+\overline{\gamma}_k(s',s)) \quad (38)$$

$$L(u_{k,2})=\max_{(u_{k,2}=1)}(\overline{\alpha}_{k-1}(s')+\overline{\beta}_k(s)+\overline{\gamma}_k(s,s))-\max_{(u_{k,2}=-1)}(\overline{\alpha}_{k-1}(s')+\overline{\beta}_k(s')+\overline{\gamma}_k(s',s)) \quad (39)$$

Compute the extrinsic information as $$L_{12}{}^e(u_{k,1})=L(u_{k,1})-L_{21}{}^e(u_{k,1})-L_c y_{k,1} \quad (40)$$

$$L_{12}{}^e(u_{k,2})=L(u_{k,2})-L_{21}{}^e(u_{k,2})-L_c y_{k,2} \quad (41)$$

where $L_{21}{}^e(u_{k,1})$ and $L_{21}{}^e(u_{k,2})$ are the extrinsic information computed by and fed from the second decoder 73 (through the deinterleaver 79). The value of extrinsic information is set to be a constant in the first decoding where the second decoder has not performed its decoding. $L_c y_{k,1}$ and $L_c y_{k,2}$ are the channel values as described above.

Then the extrinsic information $L_{12}{}^e(u_1)$, $L_{12}{}^e(u_{k,2})$ is interleaved by the first interleaver 75, and fed into the second decoder 73.

The received message bits $X_{k,1}$, $X_{k,2}$ output from the modulator are interleaved by the second interleaver 77 and then input to the second decoder 73. A parity check bit $Y_{k,2}$ is also input to the second decoder 73. Thus, the second decoder 73 receives the interleaved message bits $X_{k,1}{}^I$, $X_{k,2}{}^I$, a parity-check bit $Y_{k,2}$, and the interleaved extrinsic information of the message bits $L_{12}{}^e(u_1)$, $L_{12}{}^e(u_{k,2})$. The second decoder 73 performs the 8-PSK mapping and calculates the reliability information ($R_1$, $R_2$, $R_3$) by replacing calculation of $(I-I_i)^2+(Q-Q_i)^2$ with calculation of $-2(I_i \times I+Q_i \times Q)$, in the same manner as the first decoder 71.

The second decoder 73 repeats the same decoding procedure as that of the first decoder 71. That is, the second decoder 73 decodes the received symbol using the calculated reliability information ($R_1$, $R_2$, $R_3$) and a priori information, and produces estimated message bits. The a priori information in the second decoder 73 is the interleaved extrinsic information $L_{12}{}^e(u_1)$, $L_{12}{}^e(u_{k,2})$ fed from the first decoder 71. The Max-Log approximation described above is used in the second decoder 73 and produces the estimation of the message bits:

$$L(u_{k,1})=\max_{(u_{k,1}=1)}(\overline{\alpha}_{k-1}(s')+\overline{\beta}_k(s)+\overline{\gamma}_k(s',s))-\max_{(u_{k,1}=-1)}(\overline{\alpha}_{k-1}(s')+\overline{\beta}_k(s')+\overline{\gamma}_k(s',s)) \quad (42)$$

$$L(u_{k,2})=\max_{(u_{k,2}=1)}(\overline{\alpha}_{k-1}(s')+\overline{\beta}_k(s)+\overline{\gamma}_k(s,s))-\max_{(u_{k,2}=-1)}(\overline{\alpha}_{k-1}(s')+\overline{\beta}_k(s')+\overline{\gamma}_k(s',s)) \quad (43)$$

The second decoder 73 then calculates difference between the received message bits and the estimated message bits, i.e., the extrinsic information of the estimated message bits:

$$L_{21}{}^e(u_{k,1})=L(u_{k,1})-L_{12}{}^e(u_{k,1})-L_c y_{k,1} \quad (44)$$

$$L_{21}{}^e(u_{k,2})=L(u_{k,2})-L_{12}{}^e(u_{k,2})-L_c y_{k,2} \quad (45)$$

The extrinsic information $L_{21}{}^e(u_{k,1})$, $L_{21}{}^e(u_{k,2})$ is then de-interleaved by the deinterleaver 79 and input to the first decoder 71 for next iteration. The first decoder 71 uses the extrinsic information from the second decoder 73. as the a priori information in this iteration and thereafter.

The decoding process at the first and second decoders 71 and 73 is iterated until a required or desired bit error rate (BER) is achieved. Then, a final decoder output is output from the turbo decoder 70 after an appropriate deinterleaving.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for decoding a received symbol representing data bits including message bits and parity-check bits, said method comprising:

mapping said symbol onto a received signal point in a signal space, said signal point having an in-phase component (I) and a quadrature phase component (Q) in said signal space;

computing reliability information for each data bit, said reliability information associated with a distance $d_i=\sqrt{(I-I_i)^2+(Q-Q_i)^2}$ between said received signal point (I, Q) and a reference constellation point ($I_i$, $Q_i$) in said signal space, where i=0, 1, ..., M−1 (for M an integer), by replacing calculation of $(I-I_i)^2+(Q-Q_i)^2$ with calculation of $-2(I_i \times I+Q_i \times Q)$;

decoding said received symbol using said reliability information and a priori information to produce estimated message bits, said a priori information having a predetermined value in a first decoding;

calculating difference between received message bits and said estimated message bits to produce extrinsic information of estimated message bits; and repeating at least once said mapping, computing, decoding and calculating, using said extrinsic information produced in a preceding calculating as said a priori information.

2. The method of claim 1, wherein said reliability information is in a form of $$R = \log\left(\left(\sum_i \exp\left(-\frac{E_s}{N_0}((I-I_i)^2+(Q-Q_i)^2)\right)\right)\middle/ \left(\sum_j \exp\left(-\frac{E_s}{N_0}((I-I_j)^2+(Q-Q_j)^2)\right)\right)\right)$$

where symbol energy is $E_s$, additive white Gaussian noise has zero mean and power spectral density $$\frac{N_0}{2},$$

i is summation for subset of M, and j is summation for another subset of M.

3. The method of claim 2, wherein in said computing, said reliability information R is obtained using the Max-Log operation: max $\log(X_0, X_1)$=max($X_0$, $X_1$)+f($X_0$, $X_1$), where f(x) is a correction term, calculation of R being $$R \approx \max \log(2 \times E_s \times (I_i \times I+Q_i \times Q))-\max \log(2 \times E_s \times (I_j \times I+Q_j \times Q)).$$

4. The method of claim 1, wherein said received symbol is coded by 8-array Phase Shift Keying Turbo coding, and said reliability information is in a form of:

$$R_1 = \log\left(\left(\sum_{i=0,1,2,3} \exp\left(-\frac{E_s}{N_0}((I-I_i)^2 + (Q-Q_i)^2)\right)\right)\right/$$
$$\left(\sum_{j=4,5,6,7} \exp\left(-\frac{E_s}{N_0}((I-I_j)^2 + (Q-Q_j)^2)\right)\right)\right)$$

$$R_2 = \log\left(\left(\sum_{i=0,1,4,5} \exp\left(-\frac{E_s}{N_0}((I-I_i)^2 + (Q-Q_i)^2)\right)\right)\right/$$
$$\left(\sum_{j=2,3,6,7} \exp\left(-\frac{E_s}{N_0}((I-I_j)^2 + (Q-Q_j)^2)\right)\right)\right)$$

$$R_3 = \log\left(\left(\sum_{i=0,2,4,6} \exp\left(-\frac{E_s}{N_0}((I-I_i)^2 + (Q-Q_i)^2)\right)\right)\right/$$
$$\left(\sum_{j=1,3,5,7} \exp\left(-\frac{E_s}{N_0}((I-I_j)^2 + (Q-Q_j)^2)\right)\right)\right)$$

where symbol energy is $E_s$ and additive white Gaussian noise has zero mean and power spectral density $$\frac{N_0}{2}.$$

5. The method of claim 4, wherein in said computing, said reliability information is obtained using the Max-Log approximation:

max log($X_0$, $X_1$)=max($X_0$, $X_1$)+f($X_0$, $X_1$), where f(x) is a correction term, calculation of $R_1$, $R_2$, and $R_3$ being $R_1 \approx \max \log(2 \times E_s \times (I_i \times I + Q_i \times Q)) - \max \log(2 \times E_s \times (I_j \times I + Q_j \times Q))$ where i=0, 1, 2, 3 and j=4, 5, 6, 7;

$R_2 \approx \max \log(2 \times E_s \times (I_i \times I + Q_i \times Q)) - \max \log(2 \times E_s \times (I_j \times I + Q_j \times Q))$ where i=0, 1, 4, 5 and j=2, 3, 6, 7; and $R_3 \approx \max \log(2 \times E_s \times (I_i \times I + Q_i \times Q)) - \max \log(2 \times E_s \times (I_j \times I + Q_j \times Q))$ where i=0, 2, 4, 6 and j=1, 3, 5, 7.

6. The method of claim 1, further comprising interleaving said extrinsic information before being used in a next decoding.

7. The method of claim 6, further comprising deinterleaving said extrinsic information before being used in a next decoding.

8. The method of claim 7, wherein said interleaving and deinterleaving are alternately performed in said repeating.

9. An apparatus for decoding a received symbol representing data bits including message bits and parity-check bits, said apparatus comprising:

means for mapping said symbol onto a received signal point in a signal space, said signal point having an in-phase component (I) and a quadrature phase component (Q) in said signal space;

means for computing reliability information for each data bit, said reliability information associated with a distance $d_i = \sqrt{(I-I_i)^2 + (Q-Q_i)^2}$ between said received signal point (I, Q) and a reference constellation point ($I_i$, $Q_i$) in said signal space, where i=0, 1, ..., M−1 (for M an integer), by replacing calculation of $(I-I_i)^2 + (Q-Q_i)^2$ with calculation of $-2(I_i \times I + Q_i \times Q)$;

means for decoding said received symbol using said reliability information and a priori information to produce estimated message bits, said a priori information having a predetermined value in a first decoding;

means for calculating difference between received message bits and said estimated message bits to produce extrinsic information of estimated bits; and mans for repeating at least once said mapping, computing, decoding and calculating, using said extrinsic information produced in a preceding calculating as said a priori information.

10. The apparatus of claim 9, wherein said reliability information is in a form of $$R = \log\left(\left(\sum_{i} \exp\left(-\frac{E_s}{N_0}((I-I_i)^2 + (Q-Q_i)^2)\right)\right)\right/$$
$$\left(\sum_{j} \exp\left(-\frac{E_s}{N_0}((I-I_j)^2 + (Q-Q_j)^2)\right)\right)\right)$$

where symbol energy is $E_s$, additive white Gaussian noise has zero mean and power spectral density $$\frac{N_0}{2},$$

i is summation for subset of M, and j is summation for another subset of M.

11. The apparatus of claim 10, wherein said means for computing obtains said reliability information R using the Max-Log operation:

max log($X_0$, $X_1$)=max($X_0$, $X_1$)+f($X_0$, $X_1$), where f(x) is a correction term, calculation of R being $R \approx \max \log(2 \times E_s \times (I_i \times I + Q_i \times Q)) - \max \log(2 \times E_s \times (I_j \times I + Q_j \times Q))$.

12. The apparatus of claim 9, wherein said received symbol is coded by 8-array Phase Shift Keying Turbo coding, and said reliability information is in a form of:

$$R_1 = \log\left(\left(\sum_{i=0,1,2,3} \exp\left(-\frac{E_s}{N_0}((I-I_i)^2 + (Q-Q_i)^2)\right)\right)\right/$$
$$\left(\sum_{j=4,5,6,7} \exp\left(-\frac{E_s}{N_0}((I-I_j)^2 + (Q-Q_j)^2)\right)\right)\right)$$

$$R_2 = \log\left(\left(\sum_{i=0,1,4,5} \exp\left(-\frac{E_s}{N_0}((I-I_i)^2 + (Q-Q_i)^2)\right)\right)\right/$$
$$\left(\sum_{j=2,3,6,7} \exp\left(-\frac{E_s}{N_0}((I-I_j)^2 + (Q-Q_j)^2)\right)\right)\right)$$

$$R_3 = \log\left(\left(\sum_{i=0,2,4,6} \exp\left(-\frac{E_s}{N_0}((I-I_i)^2 + (Q-Q_i)^2)\right)\right)\right/$$
$$\left(\sum_{j=1,3,5,7} \exp\left(-\frac{E_s}{N_0}((I-I_j)^2 + (Q-Q_j)^2)\right)\right)\right)$$

where symbol energy is $E_s$ and additive white Gaussian noise has zero mean and power spectral density $$\frac{N_0}{2}.$$

13. The apparatus of claim 12, wherein said means for computing obtains said reliability information using the Max-Log approximation:

max log($X_0$, $X_1$)=max($X_0$, $X_1$)+f($X_0$, $X_1$), where f(x) is a correction term, calculation of $R_1$, $R_2$, and $R_3$ being $$R_1 \approx \max \log(2 \times E_s \times (I_i \times I + Q_i \times Q)) - \max \log(2 \times E_s \times (I_j \times I + Q_j \times Q))$$

where i=0, 1, 2, 3 and j=4, 5, 6, 7;

$$R_2 \approx \max \log(2 \times E_s \times (I_i \times I + Q_i \times Q)) - \max \log(2 \times E_s \times (I_j \times I + Q_j \times Q))$$

where i=0, 1, 4, 5 and j=2, 3, 6, 7; and $$R_3 \approx \max \log(2 \times E_s \times (I_i \times I + Q_i \times Q)) - \max \log(2 \times E_s \times (I_j \times I + Q_j \times Q))$$

where i=0, 2, 4, 6 and j=1, 3, 5, 7.

14. The apparatus of claim 9, further comprising means for interleaving said extrinsic information before being used in a next iteration by said means for decoding.

15. The apparatus of claim 14, further comprising means for deinterleaving said extrinsic information before being used in a next iteration by said means for decoding.

16. The apparatus of claim 15, wherein said means for repeating alternately uses said means for interleaving and said means for deinterleaving in successive iteration of decoding.

17. A decoding module for performing an iteration of decoding a received symbol, said received symbol representing data bits including message bits and parity-check bits, said decoding module comprising:
a first input for inputting said data bits of said received symbol;
a second input for inputting extrinsic information of estimated message bits;
an output for outputting extrinsic information of estimated message bits;
a reliability information determiner for mapping said data bits onto a received signal point in a signal space, said signal point having an in-phase component (I) and a quadrature phase component (Q) in said signal space, and for computing reliability information for each data bit, said reliability information associated with a distance $d_i=\sqrt{(I-I_i)^2+(Q-Q_i)^2}$ between said received signal point (I, Q) and a reference constellation point ($I_i$, $Q_i$) in said signal space, where i=0, 1, . . . , M−1 (for M an integer), by replacing calculation of $(I-I_i)^2+(Q-Q_i)^2$ with calculation of $-2(I_i \times I+Q_i \times Q)$; and
a decoder for decoding said received symbol using said reliability information and a priori information to produce estimated message bits, said a priori information being said extrinsic information of estimated message bits input from said second input, and for calculating difference between received message bits and said estimated message bits to produce extrinsic information of said estimated message bits.

18. The decoding module of claim 17, wherein said a priori information is set to be a predetermined value in a first iteration.

19. The decoding module of claim 17, further comprising an interleaver for interleaving said extrinsic information of said estimated message bits.

20. The decoding module of claim 17, wherein said output is coupled with a second input of another decoding module capable of performing an identical iteration of said decoding.

21. The decoding module of claim 20, wherein said second input is coupled with an output of another decoding module capable of performing an identical iteration of said decoding.

22. The decoding module of claim 21, wherein said reliability information is in a form of $$R = \log\left(\left(\sum_i \exp\left(-\frac{E_s}{N_0}((I-I_i)^2+(Q-Q_i)^2)\right)\right)\right/$$
$$\left(\sum_j \exp\left(-\frac{E_s}{N_0}((I-I_j)^2+(Q-Q_j)^2)\right)\right)\right)$$

where symbol energy is $E_s$, additive white Gaussian noise has zero mean and power spectral density $$\frac{N_0}{2},$$

i is summation for subset of M, and j is summation for another subset of M.

23. The decoding module of claim 22, wherein said reliability information determiner computes said reliability information R using the Max-Log operation:

max log($X_0$, $X_1$)=max($X_0$, $X_1$)+f($X_0$, $X_1$), where f(x) is a correction term, calculation of R being $$R \approx \max \log(2 \times E_s \times (I_i \times I + Q_i \times Q)) - \max \log(2 \times E_s \times (I_j \times I + Q_j \times Q)).$$

24. The decoding module of claim 21, wherein said received symbol is coded by 8-array Phase Shift Keying Turbo coding, and said reliability information is in a form of:

$$R_1 = \log\left(\left(\sum_{i=0,1,2,3} \exp\left(-\frac{E_s}{N_0}((I-I_i)^2+(Q-Q_i)^2)\right)\right)\right/$$
$$\left(\sum_{j=4,5,6,7} \exp\left(-\frac{E_s}{N_0}((I-I_j)^2+(Q-Q_j)^2)\right)\right)\right)$$

$$R_2 = \log\left(\left(\sum_{i=0,1,4,5} \exp\left(-\frac{E_s}{N_0}((I-I_i)^2+(Q-Q_i)^2)\right)\right)\right/$$
$$\left(\sum_{j=2,3,6,7} \exp\left(-\frac{E_s}{N_0}((I-I_j)^2+(Q-Q_j)^2)\right)\right)\right)$$

$$R_3 = \log\left(\left(\sum_{i=0,2,4,6} \exp\left(-\frac{E_s}{N_0}((I-I_i)^2+(Q-Q_i)^2)\right)\right)\right/$$
$$\left(\sum_{j=1,3,5,7} \exp\left(-\frac{E_s}{N_0}((I-I_j)^2+(Q-Q_j)^2)\right)\right)\right)$$

where symbol energy is $E_s$ and additive white Gaussian noise has zero mean and power spectral density $$\frac{N_0}{2}.$$

25. The decoding module of claim 24, wherein said reliability information determiner computes said reliability information using the Max-Log approximation:

max log($X_0$, $X_1$) = max($X_0$, $X_1$) + f($X_0$, $X_1$), where f(x) is a correction term, calculation of $R_1$, $R_2$, and $R_3$ being $$R_1 \approx \max \log(2 \times E_s \times (I_i \times I + Q_i \times Q)) - \max \log(2 \times E_s \times (I_j \times I + Q_j \times Q))$$

where i=0, 1, 2, 3 and j=4, 5, 6, 7;

$$R_2 \approx \max \log(2 \times E_s \times (I_i \times I + Q_i \times Q)) - \max \log(2 \times E_s \times (I_j \times I + Q_j \times Q))$$

where i=0, 1, 4, 5 and j=2, 3, 6, 7; and $$R_3 \approx \max \log(2 \times E_s \times (I_i \times I + Q_i \times Q)) - \max \log(2 \times E_s \times (I_j \times I + Q_j \times Q))$$

where i=0, 2, 4, 6 and j=1, 3, 5, 7.

26. A program storage device readable by a machine, tangibly embodying a program of instructions executable by the machine to perform a method for decoding a received symbol representing data bits including message bits and parity-check bits, said method including:

mapping said symbol onto a received signal point in a signal space, said signal point having an in-phase component (I) and a quadrature phase component (Q) in said signal space;

computing reliability information for each data bit, said reliability information associated with a distance $d_i = \sqrt{(I-I_i)^2 + (Q-Q_i)^2}$ between said received signal point (I, Q) and a reference constellation point ($I_i$, $Q_i$) in said signal space, where i=0, 1, ..., M−1 (for M an integer), by replacing calculation of $(I-I_i)^2 + (Q-Q_i)^2$ with calculation of $-2(I_i \times I + Q_i \times Q)$;

decoding said received symbol using said reliability information and a priori information to produce estimated message bits, said a priori information having a predetermined value in a first decoding;

calculating difference between received message bits and said estimated message bits to produce extrinsic information of estimated message bits; and repeating at least once said mapping, computing, decoding and calculating, using said extrinsic information produced in a preceding calculating as said a priori information.

\* \* \* \* \*